United States Patent [19]

Natarajan et al.

[11] Patent Number: 5,783,026
[45] Date of Patent: Jul. 21, 1998

[54] APPARATUS FOR STACKING SHEETS BY CARRIERS

[75] Inventors: Govindarajan Natarajan, Pleasant Valley; John Ulrich Knickerbocker, Hopewell Junction; Robert William Pasco, Wappingers Falls, all of N.Y.

[73] Assignee: International Business Machines Corporation, Armonk, N.Y.

[21] Appl. No.: 448,692

[22] Filed: May 24, 1995

[51] Int. Cl.$^6$ .................................... B32B 35/00
[52] U.S. Cl. .................. 156/378; 156/379.8; 156/497; 156/512; 156/517; 156/558; 156/563
[58] Field of Search .................. 156/378, 379.8, 156/497, 512, 517, 558, 563

[56] References Cited

U.S. PATENT DOCUMENTS

| | | |
|---|---|---|
| 4,929,295 | 5/1990 | Kohno et al. |
| 4,960,361 | 10/1990 | Melzer |
| 5,174,842 | 12/1992 | Hamuro et al. ............. 156/89 |
| 5,261,986 | 11/1993 | Kawabata et al. |
| 5,358,593 | 10/1994 | Hamuro et al. |

FOREIGN PATENT DOCUMENTS

| | | |
|---|---|---|
| 0 530 052 A1 | 3/1993 | European Pat. Off. ......... H01C 4/30 |
| 0530052A1 | 3/1993 | European Pat. Off. |
| 4078118A | 3/1992 | Japan . |
| 5198947A | 8/1993 | Japan . |

OTHER PUBLICATIONS

K.L. Chu "Microprous Pad Device for Fragile Material Handling" IBM Technical Disclosure Bulletin vol. 32, No. 6A Nov. 1989.

DeRobertis et al. "Vacuum–Operated Greensheet Handler" IBM Technical Disclosure Bulletin vol. 24 No. 4 Sep. 1981.

*Primary Examiner*—Jenna Davis
*Attorney, Agent, or Firm*—Whitham, Curtis, Whitham & McGinn; Ira D. Blecker

[57] ABSTRACT

A method and apparatus for processing sheets, includes placing a sheet on a carrier to form a sheet/carrier structure, sizing the sheet/carrier structure, stacking the sheet/carrier structure in a stacking apparatus having a second sheet stacked in advance therein, so that the sheet contacts the second sheet, aligning the sheets with pins, tacking the sheet to the second sheet and removing the carrier.

11 Claims, 5 Drawing Sheets

5,783,026

APPARATUS FOR STACKING SHEETS BY CARRIERS

BACKGROUND OF THE INVENTION

1. Field of the Invention

The present invention generally relates to a method and apparatus for stacking sheets (e.g., metallized ceramic green sheets) used in producing laminated ceramic electronic components and, more particularly, to a method and apparatus for stacking large sheets (e.g., green sheets) having a size not less than 200×200 mm. For purposes of this application, "large" is defined as greater than 200×200 mm.

Generally, large green sheets can be processed more cost-effectively than standard size green sheets (e.g., sheets having a size of approximately 155 to 200×155 to 200 mm.) because of economies of scale and other factors. However, as green sheets become larger, manufacturing multilayered laminates becomes more difficult because of punching distortion, screening instability, handling loss and misalignment. The present invention provides a method and apparatus for reliably and precisely manufacturing large green sheet laminates without sheet distortion or misalignment.

2. Description of the Related Art

Typical multilayer ceramic electrical components, such as ceramic substrates and capacitors are formed from laminates (i.e., multiple sheets bonded together) of ceramic green sheets.

Green sheet laminates are typically produced by first forming a ceramic film in a continuous sheet and then drying the ceramic sheet. Thereafter, the sheet is punched into individual square or rectangular sheets. Various desired electrode patterns are formed and dried on the sheets, depending upon the electrical component to be produced, in a process called "screening". Then, the patterned sheets are stacked and bonded to form a laminate, and the laminate is cut into individual electrical components.

Specifically, the processing steps of transporting, stacking and bonding typically require the punched and patterned sheets to be transferred to a frame by a continuous strip carrier. Then, the sheets are loaded into a frame by a vacuum holder and are bonded together by heat and/or pressure. The sheets either are bonded one sheet at a time or many sheets may be bonded together simultaneously. Examples of such conventional processes are disclosed in European Patent Application Publication Number 0 530 052 A1 to Takaoka et al. and U.S. Pat. No. 5,174,842 to Hamuro et al.

The above conventional processes and apparatuses have several problems. For example, performing the required processing steps of transporting, cutting the green sheet and the carrier simultaneously, stacking and bonding the aligned patterned sheets correctly is crucial in producing defect-free electronic components. However, as mentioned above, such steps typically result in sheets which are misaligned with one another or sheets which are bonded insufficiently or improperly.

The misalignment results from inaccurate simultaneous shearing of a rigid carrier film and green sheet where there are unavoidably low tolerances between the punch and the frame holding the green sheet. The carrier film will also distort with the green sheet during the cutting thereof due to the nature of the high modulus carrier film that is used. This problem occurs, even though the purpose of the carrier film is to minimize the distortion and to increase stability. Also, the conventional full area individual thermal bonding process may distort the green sheet.

If sheets are misaligned or insufficiently bonded, the respective electrical connections between the sheets may be missed or only partially made, thereby resulting in short-circuiting problems and the like. Further, the capacitance of the electronic component may be inconsistent or outside the desired range. Also, internal electrodes may be severed during later cutting steps if they are improperly aligned.

Therefore, conventional stacking methods and apparatus are not well-suited for large green sheet technology.

SUMMARY OF THE INVENTION

In view of the foregoing problems of the conventional systems, an object of the present invention is to provide a structure and method for manufacturing laminated sheets while minimizing handling loss, misalignment or punching distortion.

Yet another object of the invention is to increase production of electronic components by forming a plurality of separate laminate green sheets simultaneously from common large green sheets.

According to a first aspect of the present invention, a method of processing sheets, comprises the following steps: placing a sheet on a carrier to form a sheet/carrier structure, sizing the sheet/carrier structure, stacking the sheet/carrier structure in a stacking apparatus having a second sheet stacked in advance therein, so that the sheet contacts the second sheet, tacking the sheet to the second sheet and removing the carrier.

In the above method according to the present invention, a full-area contact carrier film supports the sheet (e.g., preferably, a large green sheet) from the punching step onwards. The full-area contact carrier reliably holds the large green sheet during punching, screening and transportation, thereby preventing distortion and breakage. The carrier approach is beneficial to reduce distortion and screening instability in the case of fine groundrule electronic packages built with either small or large green sheets.

According to a second aspect of the present invention, an apparatus for stacking sheets (e.g., preferably large green sheets) is provided that includes a frame having at least one pin, a stationary plate and a movable plate, the pin for receiving and aligning the sheet/carrier structure in the stacking apparatus, means for removing the carrier from the sheet in the sheet/carrier structure and a tacking device positioned relative to the frame for tacking a second sheet of a second sheet/carrier structure received by the frame and having had its carrier removed therefrom, to the sheet.

Specifically, the sheet mounted on a carrier sheet is placed, carrier side up, on a second sheet having been stacked in the frame using the pin(s) for alignment. The tacking device tacks the sheet to the second sheet, preferably around a non-active/non-metallized area, and the means for separating removes the carrier from the sheet.

Thus, the apparatus according to the present invention is preferably for stacking the large green sheets includes a stationary stripper plate and a movable frame with pin(s) that extend through the stripper plate. The large green sheets have a hole(s) for being mounted on the pin(s). The large green sheets and full area contact carrier are mounted on the pin(s) and the stationary stripper plate.

The stripper plate is stationary. However, the movable frame can be relocated to allow the pin(s) to protrude through the stripper plate a variable distance depending upon the height of the stack of large green sheets.

The second and subsequent large green sheets to be stacked are bonded to the uppermost large green sheet in the stack by a tacking device that uses heat and/or pressure, to form a bond between the upper two large green sheets.

Once the large green sheets are bonded, the full area contact carrier is removed from the top large green sheet. The carrier is removed by peeling (e.g., with vacuum chucks and by means of air jets).

The apparatus according to the present invention ensures proper sheet alignment (within approximately 12 microns) and carrier removal without distortion. Further, due to the large green sheets being supported by the carrier, the green sheets can be held flat (without sagging) and positioned accurately on location pin(s). Distortion caused during handling is minimized, if not completely eliminated, because the rigid carrier film is removed only after the tacking process. Also, proper sheet to sheet alignment is continuously ensured by tacking the green sheets in non-active areas thereof.

According to a third aspect of the present invention, a method of handling and blanking (i.e., cutting or shearing) sheets (e.g., preferably large green sheets) is provided.

The method includes the steps placing a sheet on a carrier to form a sheet/carrier structure, sizing the sheet/carrier structure, placing the sheet/carrier on a stationary holder such that the carrier contacts the holder and the sheet/carrier are aligned with the stationary holder; removing, with a movable vacuum holder, the carrier from the sheet, positioning the sheet in a blanking apparatus using the movable vacuum holder, blanking the sheet into a plurality of smaller sheets such that the smaller sheets are stacked.

According to a fourth aspect of the present invention, an apparatus for handling and blanking sheets (e.g., preferably large green sheets) includes a transfer apparatus comprising a stationary vacuum holder and a movable vacuum holder, the movable vacuum holder having cut-out regions corresponding to a desired sheet size and vacuum holes surrounding the cut-out regions, and a blanking apparatus, operatively connected to the transfer apparatus, having predetermined regions, wherein the sheet/carrier structure is positioned on the stationary vacuum holder so that the carrier contacts the stationary vacuum holder, the stationary vacuum holder including separating means for separating the sheet from the carrier and the movable vacuum holder including holding means for removing the sheet from the carrier and positioning the sheet in the blanking apparatus, wherein the sheet is blanked, through the cut-out regions of the movable vacuum holder, into a plurality of smaller sheets, so that the smaller sheets are stacked in the predetermined regions.

Thus, according to the third and fourth aspects of the invention, the large green sheet and full area contact carrier or edge support frame are placed on a movable vacuum holder having pin(s) protruding therefrom, thereby allowing the large green sheet to be properly aligned with the holder. Then, the carrier is removed by peeling. However, the large green sheet is not bonded to the next large green sheet. Instead, the large green sheet is punched (blanked) into four squares or rectangles of substantially equal-sized standard green sheets. The blanking process places the four equal-sized squares or rectangles into a lamination frame.

The lamination frame includes a plurality (e.g., four) of separate cavities (compartments) of a larger framework. The tolerance within the cavities requires the precise alignment of the standard green sheets.

Then, the upper standard green sheet is bonded to the next highest standard green sheet using heat and/or pressure as discussed above.

This method and apparatus allows a plurality of stacks of regular green sheets to be stacked and laminated simultaneously. Thus, regular green sheets can be produced more quickly and less expensively than by conventional systems.

According to a fifth aspect of the present invention, an apparatus for stacking sheets is provided as in the first aspect. However, the pin(s) are connected to the stationary stripper plate and the movable frame includes an elevator mechanism.

The fifth aspect of the invention is substantially similar to the first aspect of the invention except that the pin(s) are incorporated into the stationary stripper plate. The stationary stripper plate has an opening that allows an elevator mechanism to support the large green sheets. The elevator mechanism moves vertically to lower the large green sheets as the stack becomes larger.

Thus, by vertically controlling the elevator mechanism the pin(s) extend an appropriate distance to ensure proper alignment without interfering with placement or removal of the large green sheets or the stack. The elevator mechanism is moved upward above the level of pin(s) to remove the stack from the stationary stripper plate.

In sum, it is projected that the cost per substrate would be reduced by a factor of two to four when large green sheets are used instead of standard sized green sheets. This cost reduction is due to decreased processing cost per sheet, labor saving, floor space saving, etc. It is also known that, as the size of the green sheets increase, greater innovation is needed (both tool and process) to minimize the punching distortion, screening instability, handling loss and misalignment. To ensure the manufacturability, it is proposed that a full area (contact) carrier film be used as a support for the green sheet from the punching step onwards. It is essential that this support film be removed without sheet distortion during the stacking operation and that good alignment is ensured.

In this application, several tool concepts are disclosed for carrier removal that do not cause distortion and that ensure sheet to sheet alignment within approximately 12 microns. A first concept includes an elevator frame stacking with the stack-tack-and-peel tool. The green sheets are stacked on pin(s) using location holes. The pin(s) are part of the lamination frame. The frame contains two plates. One of the plates is a movable frame which has locations pin(s) fixed permanently. The second plate is a stripper plate.

The movable frame is movable upwardly and downwardly in a controllable manner depending on sheet thickness. Every time a sheet is placed on the stack, the stack is moved downwardly a specified distance (for example, 8 mm for 8 mm sheets, etc.), by punching down the stack using a heated web from the top. This operation achieves several advantages. First, the heated web ensures that the green sheets are tacked together. Secondly, it ensures that the stack top surface is at the same level for the next layer down. Once the sheet is tacked, the carrier film can be peeled off.

This method ensures proper alignment, prevents distortion during carrier removal and provides low-cost stacking.

The second major tool concept is carrier removal with cavity-to-size-stacking. This is a relatively complex tool and ensures reliability of the stacking operation. This tool contains a carrier peeling station, where the carrier is separated by two vacuum chucks, by air jets and other means. The web design ensures proper alignment between the tool and the green sheet with respect to the location holes. The top part of the vacuum chuck travels to the blanking die and places the green sheet accurately on pin(s) and still holds the sheet by vacuum. The sheets are blanked and fall into the lamination frames. For this operation, the green sheet must be designed as shown in FIG. 5. The stacker preferably is fitted with an optical alignment system, such that individual segments can be aligned accurately, irrespective of the segment distortion.

Stacking individual segments by optical alignment using well-known procedures (such as screened marks) before blanking (cutting) helps further reduce the misalignment to less than 5 microns, it also completely eliminates the rotational distortion and minimizes the effect of overall positional error which may be present in large green sheet processing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

FIRST EMBODIMENT

Figure 1A:
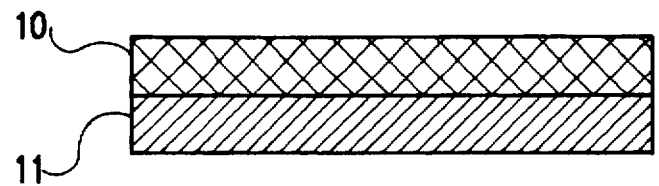
FIGS. 1a and 1b are schematic drawings of a first embodiment of the invention showing a pin-based stack, tack and peel lamination process using an exemplary large green sheet and carrier, a tacking device, a stationary stripper plate and a moveable frame with pin(s).

Referring now to the drawings, and more particularly to FIG. 1, a first embodiment is shown of the method and apparatus according to the present invention.

Figure 1B:
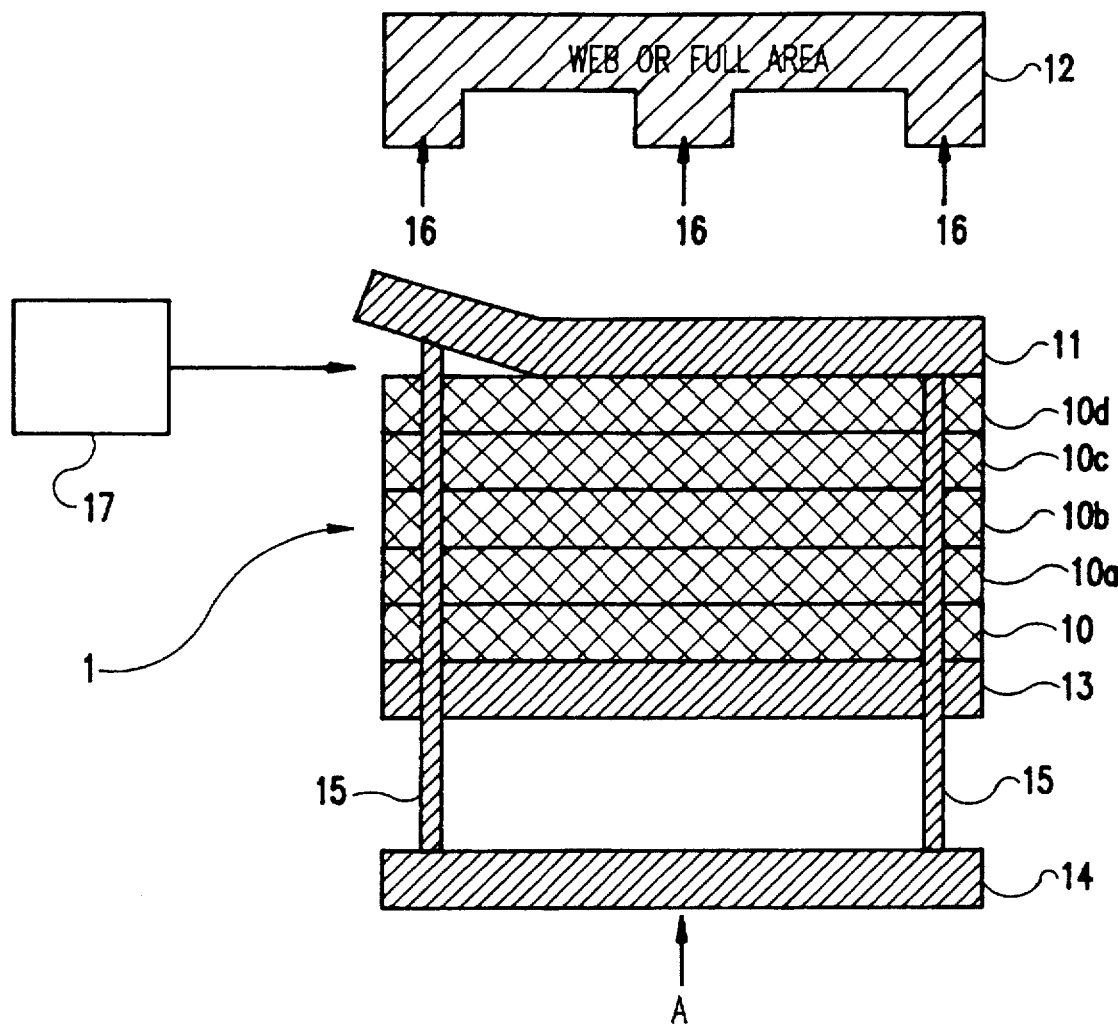

In FIGS. 1a and 1b, a large green sheet 10 is provided. As mentioned above, for purposes of this application, "large" means a sheet having a size greater than about 200×200 mm. Of course, the inventive method and apparatus can be suitably designed and used for any type of sheets which are moved and stacked and which are to be laminated together. Thus, the method and apparatus is applicable to any type of sheets and not merely green sheets. Further, while the method and apparatus are optimized for large green sheets, any size sheets may be utilized and the advantages of the inventive method and apparatus would still accrue.

The green sheet 10 preferably has a thickness of 2–40 mm and is supported by a full-area-contact carrier 11. Carrier 11 is preferably made from materials having a high modulus (>3) and a low distortion (i.e. materials that up to 150° C. distort on the order of approximately 1–2 microns/inch). Preferable examples of these materials are polyethylene terepthalate type polyesters, commercially known as "Mylar" and polyethylnaphthalate, commercially known as "PEN". The thickness of the carrier can vary from 2 mm to 10 mm and preferably has area dimensions substantially the same as those of the green sheet 10. By being substantially the same size, the green sheet is in full-area contact with carrier 11 and is reliably supported during the transport of the green sheet 10 to a punching station and other processing steps. Carrier 11 ensures that punching distortion, screening instability, handling loss and misalignment are minimized.

The green sheet 10 may be secured to the carrier 11 as part of the inventive process by heat- and/or pressure-bonding, or can be secured to carrier 11 in advance by conventional low-strength bond adhesives.

The large green sheet 10 mounted on the carrier 11 is transported by a suitable moving mechanism and is processed to include punching (not illustrated). Preferably, a vacuum holder or the like is utilized as the moving mechanism due to its ability to nondestructively transport the green sheet and carrier. The pressure of such a vacuum holder is suitably adjusted by the operator so as not to damage, wrinkle or distort the green sheet.

After being punched and subsequently processed, the green sheet 10 mounted on the carrier 11 is transported to a stacking station and the green sheet is placed, with the green sheet facing down and the carrier facing up, onto a stationary stripper plate 13 of a stacking device 1.

Stacking device 1 includes a lamination frame having first and second plates. The first plate is a stationary stripper plate 13 and the second plate is a movable frame 14. The plates are movable upwardly and downwardly in a controllable fashion (and dependent on the sheet thickness). The stacking device 1 is for stacking a plurality of green sheets.

At least one pin 15, which may be integrally formed as a portion of the lamination frame or as a separate element formed thereto, is for receiving the green sheets having been metallized and having location holes therein. Each time a green sheet is stacked and located with respect to the at least one pin, the stack is moved down, relative to the pin(s), by a predetermined distance (e.g., the thickness of a sheet) by punching down, from above, the stack using a heated web of a tacking device (described below) and by the movable frame 14 moving upward by one sheet thickness.

In the exemplary stacker 1 shown in FIG. 1b, a plurality (e.g., four, two of which are shown) of pins 15 are provided on the movable frame and extend through the stationary stripper plate 13. Generally, positioning reliability and accuracy will be increased by providing more pins.

The pin(s) 15 is adjusted vertically by movement of the movable frame 14 to have a predetermined height so as to protrude above the uppermost large green sheet of a stack of green sheets, thereby positively aligning each of the stacked large green sheets. By the same token, the pin(s) does not extend to a height that would interfere with the placement of the large green sheet onto a previously stacked large green sheet.

Thus, after the location holes in the green sheet 10 and carrier film 11 have been aligned with the pin(s) 15, the green sheet/carrier film 11 structure is placed green sheet side-first through the pin(s) 15 onto the stationary stripper plate 13. As mentioned above, preferably the green sheet 10/carrier film 11 structure is positioned by the vacuum holding tool. Thus, the carrier film is positioned in an orientation above the green sheet 10 (i.e., on the side opposite the green sheet stack) and in a position in which the carrier film 11 may be stripped from the green sheet 10.

For a first green sheet so positioned, the adhesion between the carrier film 11 and the green sheet 10 is broken and the carrier film is removed from the green sheet 10.

To break the adhesion between the carrier film and the green sheet and thereafter remove the carrier film, preferably a stripper 17 is provided which comprises an air peeling device (e.g., an "air knife") or the like. An air peeling device is utilized so that the green sheet is not harmed, sheet distortion is prevented, and such that alignment is preserved. However, other peeling devices can also be used so long as the carrier film is reliably and efficiently removed from the respective green sheet and so long as the green sheet is not damaged or distorted during the removal of the carrier film. For example, a mechanical peeling device or an ultrasonic wave (or ultraviolet rays) generator to break the adhesion between the green sheet 10 and carrier film 11 also can be used.

Thereafter, the carrier film 11 is physically removed from the green sheet by suitable means. For example, a vacuum holding tool, the same or similar to the one described above with regard to the transporting mechanism, may be used to lift the carrier film 11 from the green sheet 10 and through the pin(s) 15. The vacuum pressure of such a device should be suitably selected such that the green sheet is not adversely affected (e.g., distorted or damaged) during transport or removal of the carrier film. As discussed in further detail below, the vacuum holding device may be integrated into a tacking device 12. The carrier film is transported to a discarding station or the like, according to the operator's needs.

Thereafter, the above steps are repeated with a second green sheet 10a/carrier film 11 structure being stacked on the first green sheet, until just before the step of removing the carrier film from the green sheet.

Figure 6:
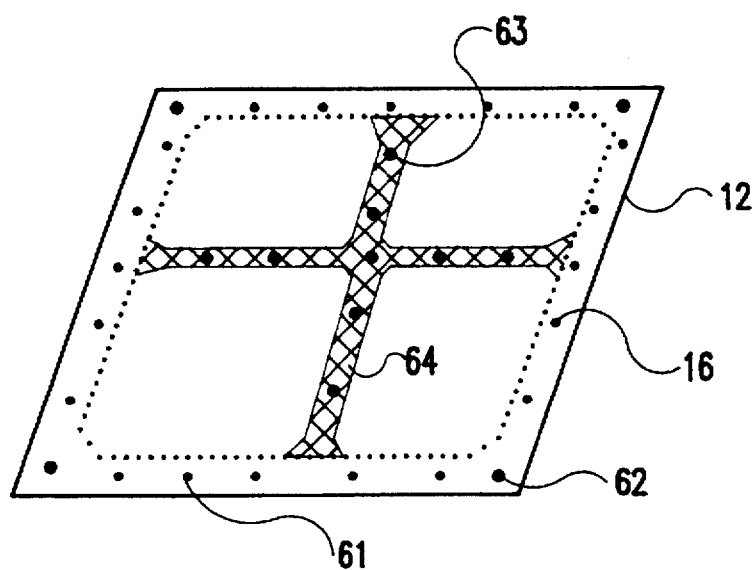
FIG. 6 is a schematic drawing of a portion of a tacking device showing tack rods, fixed pin(s) and vacuum holes.

With the second green sheet 10a stacked on the first green sheet 10 and with the carrier film upwardly exposed to a tacking device 12 or the like, the tacking device 12 applies heat from a heating element 61 (as shown in FIG. 6 and discussed below) that bonds large green sheet 10a to the previously stacked large green sheet 10.

Preferably, the tacking device 12 heats the green sheet structure to a temperature greater than the transition temperature of the polymer of the green sheets to laminate the first green sheet to the second green sheet.

Alternatively, tacking device 12 can apply pressure to bond the large green sheets by pressure means (not shown) common in the industry such as air compression devices, hydraulic systems etc. The tacking surface can be a continuous strip or plurality of hot rods of 3 mm–5 mm diameter. As yet another alternative, the combination of pressure and heat can be used together to bond the sheets together.

Thus, with the invention, the pin(s) 15 protrude above the uppermost green sheet of the stack of green sheets to positively align each added large green sheet 10 to the uppermost green sheet. However, the pin(s) preferably should not extend to a height that would interfere with the placement of the large green sheet on the previously stacked large green sheet.

As each successive large green sheet 10b, 10c, 10d, etc., is added to the stack of large green sheets the movable frame 14 moves up, as designated by the arrow A in FIG. 1, by one sheet thickness. Thus, the pin(s) 15 always protrude a predetermined height above the uppermost large green sheet 10a.

The movable frame 14 is fully lowered to allow expeditious removal of the laminate of bonded large green sheets.

Simultaneously, vacuum holes 16 driven by a common vacuum means (not shown) on the tacking device 12 peel the full area contact carrier 11 completely from the large green sheet 10. Thus, the full area contact carrier 11 is completely separated from the large green sheet 10 and discarded or reused. The large green sheet 10 is therefore ready to accept a new large green sheet to be mounted thereon.

Alternatively, the stripper 17 can supply ultraviolet rays at the area where the large green sheet 10 and the full area contact carrier 11 meet to begin the separation process, if the carrier is bonded to the green sheet with adhesives which can be removed by ultraviolet rays. The green sheet bonding technique and the separation means to separate the green sheet from the carrier can be integrated into one device such as the tacking device 12 shown in FIG. 1b.

By punching down the stack using the tacking device from above, several important benefits result. First, the tacking device ensures that the green sheets are tacked together and secondly ensures that the stack's uppermost surface is at the correct level for the next layer. Once the sheet is tacked, the carrier film can be peeled off. This method of the first embodiment of the invention ensures precise alignment, prevents distortion during carrier removal and provides a low-cost and efficient stacking operation.

SECOND EMBODIMENT

Figure 2A:
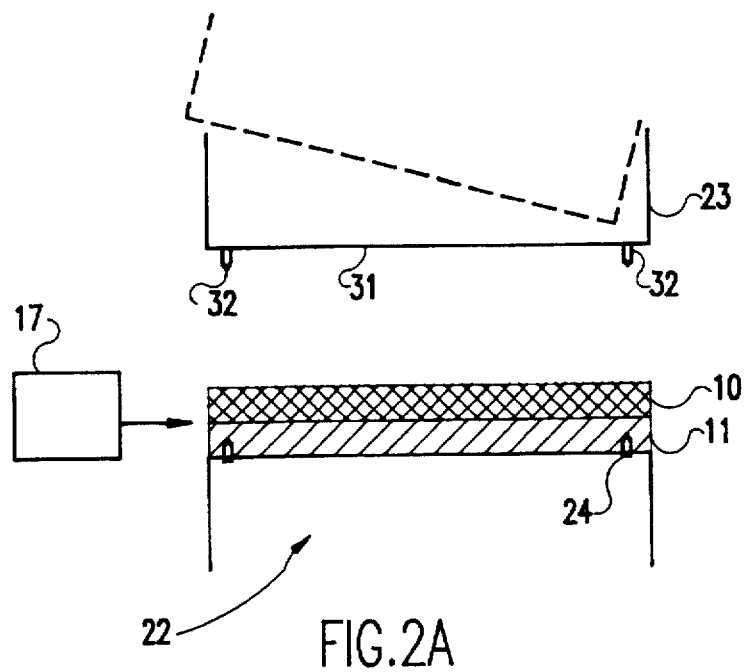
FIGS. 2a and 2b are schematic drawings of a second embodiment of the invention showing a peeling, stacking and lamination process using an exemplary stationary vacuum holder, a movable vacuum holder, a punch and a lamination frame including a plurality (e.g., four in the exemplary system) of cavities.
Figure 2B:
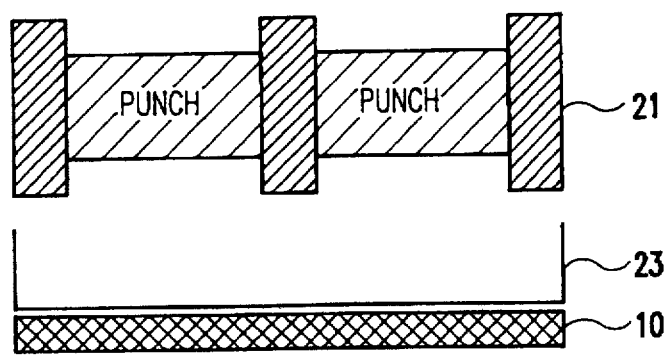
Figure 2B:
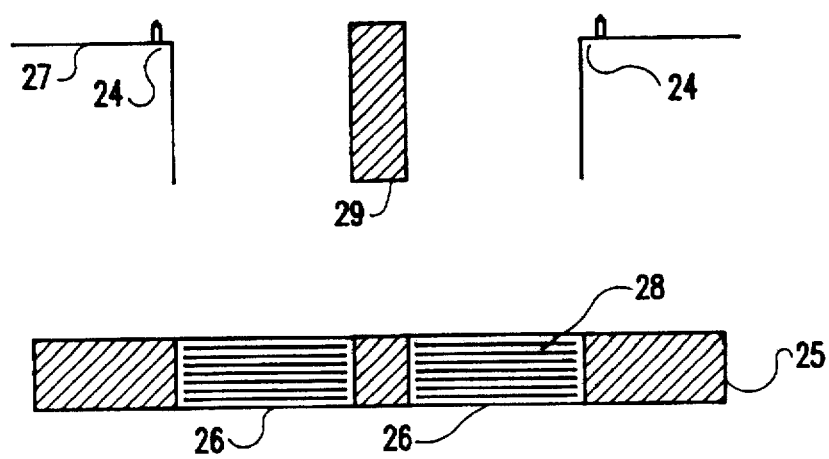
Figure 3:
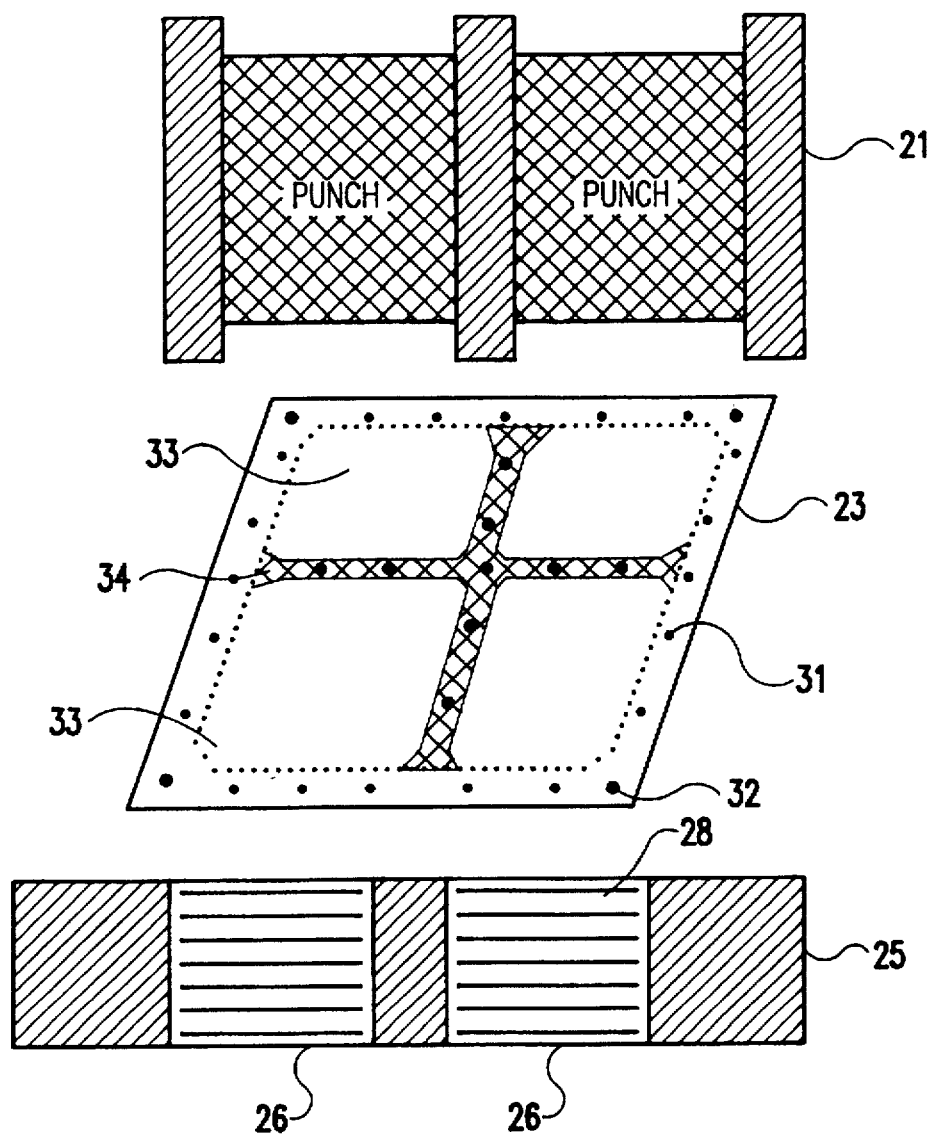
FIG. 3 is schematic drawing of an alternative view of the second embodiment showing a peeling, stacking and lamination process using an exemplary stationary vacuum holder, a movable vacuum holder, a punch and a lamination frame including a plurality (e.g., four in the exemplary system) of cavities.

FIGS. 2a, 2b and 3 illustrate a second embodiment of the invention and generally relate to carrier removal along with cavity-to-size stacking in which the reliability of the stacking operation is ensured.

In the second embodiment, a large green sheet 10 having a full-area-contact carrier 11 attached thereto is initially positioned in a stack in a tray or the like. A first surface (e.g., the top surface) of each of the green sheets may be suitably cleaned by vacuum, air jet or brush after being picked up from the tray.

Thereafter, the green sheet/carrier film structure is positioned on a stationary vacuum holder 22 with the carrier facing down and the green sheet facing up. The carrier is correctly positioned on the stationary vacuum by aligning at least one fixed pin(s) 29 on the upper surface of the stationary vacuum holder with corresponding holes in the carrier.

The large green sheet 10 is peeled from the carrier 11 by the stripper 17 and vacuum means 31 of a movable vacuum holder 23 in a process substantially the same or similar to the peeling process discussed above. The carrier peeling station used to separate the carrier may include vacuum chucks and air jets or the like (UV or ultrasonic waves). The movable vacuum holder 23 is correctly positioned on the green sheet by aligning the pin(s) 32 on the surface of the movable vacuum holder with corresponding holes in the green sheet.

The movable vacuum holder 23 has the ability to tilt, as shown by the dotted lines of FIG. 2a, to allow the large green sheet to be separated from the carrier. The movable vacuum holder tilts and moves away from the stationary vacuum holder as the green sheet separates from the carrier. The degree of tilt, strength of vacuum and speed of movement are controlled so to prevent breaking, wrinkling, warping or other damage to the green sheet.

After removing the carrier 11 from the large green sheet 10, a second surface (e.g., the bottom surface) of the green sheet is cleaned. Thereafter, the movable vacuum holder 23 transports the large green sheet 10 from the stationary vacuum holder 22 to the stacking die 27.

The stacking die 27 has at least one fixed pin 24 that is similar to the pin(s) 15, as discussed above in the first embodiment. In the exemplary embodiment of FIG. 2b, a plurality of fixed pins are shown. The fixed pin(s) 24 aligns the large green sheet 10 in position on the stacking die 27 and hold the green sheet flat by vacuum.

A punch 21 cuts a plurality (e.g., in the exemplary embodiment, four) standard green sheets 28 from the large green sheet 10 and forcibly positions the standard green sheets 28 into cavities 26 of a lamination frame 25. The cut standard green sheets 28 are standard size green sheets (e.g., approximately 155 to 200×155 to 200 mm).

The punch 21 punches through the openings 33 in the movable vacuum holder 23. The openings 33 correspond to a desired size of small sheet to be produced. Then, the movable vacuum holder 23 removes the remainder of the large green sheet for disposal or reuse. The web 34 of the movable vacuum holder 23 has vacuum holes 31 surrounding the cut-out regions 33, similarly to the first embodiment, for supporting the large green sheet to prevent breakage, warpage and misalignment. The vacuum means (not shown) continues throughout the punching process to ensure that the standard green sheets are formed properly and that the punch does not cause distortion.

The cavities 26 have dimensions substantially similar to the standard green sheets 28 and therefore hold the standard green sheets 28 in proper alignment. The stacking die 27 has a web design 29, a portion of which is shown in FIG. 2b, that is similar to the web 34 and web 64 shown in FIG. 6. The web design 29 prevents the large green sheet from sagging. Also, the web has several vacuum holes for maintaining the large sheets in the proper position when the sheet is blanked by the punch 21.

When standard sheets 28 are blanked (e.g., cut) from the large green sheet, the standard sheets will expand to become a slightly (e.g., a few millimeters) larger than the stacking die cavity 26. As the punch travels into the stacking die cavity 26, the punch pushes the standard sheets down on top of the stack of standard green sheets previously in the cavity. Preferably, the distance between the punch and the top of the green sheet stack in cavity 26 be less than approximately 15 mm.

The stacks of standard green sheets are removed from the stacking tool and laminated in conventional lamination process. Alternatively, in a process similar to that of the first embodiment, each new layer of standard green sheets 28 added to the stack within the cavities 26 are bonded (by heat and/or pressure) to the previous layer of standard green sheets 28 in succession until a laminate of rectangular sections is formed.

Thus, a plurality (e.g., four) of separate laminates of standard green sheets can be formed simultaneously. As explained above, this results in decreased manufacturing time and reduced manufacturing costs. Further, an optical alignment system may be employed to ensure precise placement of the large green sheet, irrespective of segment distortion, on the stacking die 27. Optical alignment systems are known in the art and may include light receiving means and light emitting means, as well as comparator circuitry for ensuring alignment. For brevity and since such systems are believed well-known to one skilled in the art, the optical alignment systems will not be described here. The standard green sheets are stacked by this embodiment as accurately as the standard size green sheets are stacked with conventional systems.

THIRD EMBODIMENT

Figure 4:
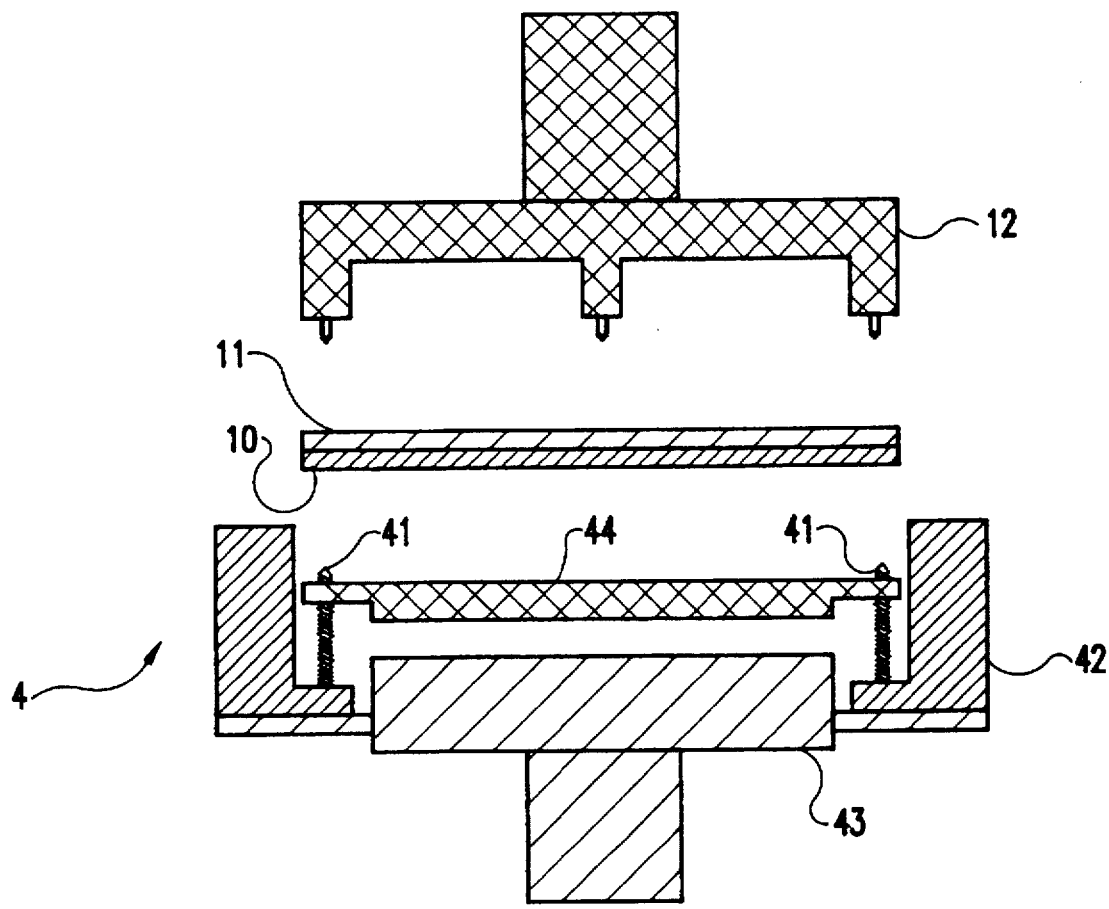
FIG. 4 is a schematic drawing of a third embodiment of the invention showing a pin-based stack, tack and peel process using an exemplary large green sheet and carrier, a tacking device, a stationary stripper plate with pin(s) and an elevator mechanism.

FIG. 4 illustrates a third embodiment of the invention which generally relates to a modification of the first embodiment by the introduction of a elevator mechanism.

In a similar manner to the first embodiment, a first green sheet/carrier 10/11 is placed in an exemplary stacker 4. The green sheet 10/carrier 11 is properly aligned by at least one fixed pin 41 connected to a stationary stripper plate 42. The fixed pin(s) 41 extends through locating holes in the green sheet 10/carrier 11 to properly maintain alignment of the stack of green sheets.

The green sheet 10/carrier 11 structure rests on a elevator mechanism 43. The stationary stripper plate 42 has an opening on its lower side to allow the elevator mechanism 43 to be vertically movable. The elevator mechanism 43 is vertically adjustable so that, as with the first embodiment, the pin(s) 41 extend a predetermined distance above the uppermost green sheet in a stack.

As with the first embodiment, the carrier 11 is removed from the first green sheet 10 by a stripper (not shown) and vacuum means contained within the tacking device 12. Thereafter, the second and subsequent green sheet 10a/carriers 11 (not shown) placed on the exemplary stacker 4 are bonded to the uppermost green sheet and then the carrier is removed, as discussed above. Similarly, the process is repeated for subsequent green sheets (10b, 10c, etc., not shown) until a laminate of green sheets is formed.

The elevator mechanism 43 is movable (vertically) upwardly to disengage the laminate of green sheets from the pin(s) 41.

As a modification of the third embodiment, bottom support plate 44 is placed in the exemplary stacker 4 on the pin(s) before the first green sheet 10/carrier 11 is placed in the exemplary stacker 4. Since the bottom support plate 44 is aligned by the pin(s), the bottom support plate 44 always remains properly aligned, regardless of whether the elevator mechanism is properly aligned. Thus, the bottom support plate 44 keeps the stack of green sheets properly aligned and insulated from any misaligning forces that may be exerted by the elevator mechanism.

Figure 5:
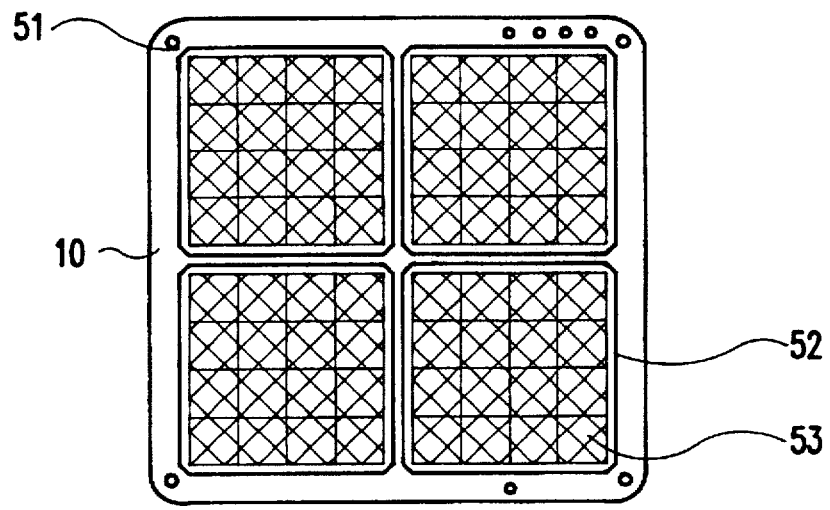
FIG. 5 is a schematic drawing of a large green sheet showing locator holes and rectangular sections.

FIG. 5 illustrates a large green sheet 10 which includes holes 51 for placement of pin(s) 15, 24, 32 and which is preferably for use with all embodiments discussed herein.

The large green sheet 10 includes rectangular sections 52 that will subsequently be separated by the above punching steps or by cutting. The rectangular sections 52 are further divided into smaller sections 53 that also may subsequently be physically removed from the remainder of the rectangular sections 52.

FIG. 6 illustrates the portion of the tacking device that contacts the green sheet 10 and/or carrier 11. As explained above, the tacking device has means for heat bonding which are shown in FIG. 6 as a plurality of tack rods 61. The tack rods 61 are programably controllable. When the green sheets are to be bonded, some or all of the tack rods 61 produce heat for a predetermined time period.

The tacking device also includes at least one fixed pin 62 for proper alignment with the green sheet 10 and/or carrier 11. The fixed pin(s) fits into corresponding hole(s) on the green sheet 10 and/or carrier 11. Vacuum holes 63 which are connected to a common vacuum means for producing a suction so as to hold the green sheet 10 and/or carrier 11, as discussed above.

While the invention has been described in terms of several preferred embodiments, those skilled in the art will recognize that the invention can be practiced with modification within the spirit and scope of the appended claims.

For example, instead of "green sheets", any type of sheets may be employed which are mounted on a carrier and which must be removed therefrom.

Having thus described our invention, what we claim as new and desire to secure by Letters Patent is as follows:

1. An apparatus for stacking sheets, said sheets being provided in advance and each of said sheets being respectively mounted on a carrier, thereby forming a sheet/carrier structure, said apparatus comprising:

a frame having at least one pin, a stationary plate and a movable plate, said at least one pin being movable relative to said sheet/carrier structure for receiving and aligning said sheet/carrier structure in said stacking apparatus;

means for removing said carrier from said sheet in said sheet/carrier structure; and a tacking device movable relative to said frame for tacking a second sheet of a second sheet/carrier structure received by said frame and having had its carrier removed therefrom, to said sheet.

2. An apparatus according to claim 1, wherein said second sheet is positioned in said frame using said at least one pin for alignment, wherein said second sheet of said second sheet/carrier structure is positioned in said frame such that a second carrier of said second sheet/carrier structure faces said tacking device and said second sheet contacts the sheet stacked in said frame, wherein said tacking device tacks said second sheet to said sheet, and said removing means removes said second carrier from said second sheet having been tacked to said sheet, said at least one pin being connected to said movable plate and extending through said stationary plate, wherein said movable plate is movable relative to said stationary plate for varying a length of said at least one pin extending through said stationary plate and said stationary plate supports said second sheet.

3. An apparatus according to claim 1, wherein said at least one pin is connected to said stationary plate and said stationary plate has an opening therein for receiving said movable plate therethrough, wherein said movable plate supports said sheet so that said sheet moves in conjunction with said movable plate.

4. An apparatus according to claim 3, further comprising a plate with at least one hole positioned on said movable plate so that said at least one pin extends through said at least one hole of said plate and said plate is positioned between said sheet and said movable plate, said plate being movable in conjunction with said movable plate.

5. An apparatus according to claim 1, wherein said tacking device includes means for applying at least one of heat and pressure to said sheet for joining said second sheet to said sheet and said tacking device further includes vacuum means for lifting and removing said carrier from said second sheet.

6. An apparatus according to claim 1, wherein said removing means comprises one means for breaking an adhesion between said carrier and said second sheet, said means for breaking includes one of an air emitter and an ultraviolet ray emitter, and said tacking device including means for peeling, via a vacuum, said carrier from said second sheet.

7. An apparatus for handling and blanking large sheets, said sheets being provided in advance and mounted on a carrier forming a sheet/carrier structure, said apparatus comprising:

a transfer apparatus comprising a stationary vacuum holder and a movable vacuum holder, said movable vacuum holder having cut-out regions corresponding to a desired sheet size and vacuum holes surrounding said cut-out regions;

a blanking apparatus, operatively connected to said transfer apparatus, having predetermined regions and a web for supporting said sheet, wherein said sheet/carrier structure is positioned on said stationary vacuum holder so that said carrier contacts said stationary vacuum holder, said stationary vacuum holder including separating means for separating said sheet of said sheet/carrier structure from said carrier of said sheet/carrier structure and said movable vacuum holder including holding means for removing said sheet from said carrier and positioning said sheet in said blanking apparatus, wherein said sheet is blanked, through the cut-out regions of the movable vacuum holder, into a plurality of smaller sheets, so that said smaller sheets are stacked in said predetermined regions.

8. An apparatus according to claim 7, wherein said stationary vacuum holder includes at least one pin, said at least one pin for being fitted into at least one hole of said sheet/carrier structure so as to align said sheet/carrier structure, said movable vacuum holder including at least one pin for being fitted into said at least one hole of said sheet and for aligning said sheet/carrier structure, and said blanking apparatus including at least one pin for being fitted into said at least one hole of said sheet thereby to align said sheet.

9. An apparatus according to claim 7, wherein said separating means includes one of an air emitter and an ultraviolet ray emitter for breaking an adhesion between said carrier and said sheet, and said movable vacuum holder is pivotable and movable so as to remove said sheet from said carrier.

10. An apparatus according to claim 7, wherein said blanking apparatus includes:

a plurality of punches, positioned above said predetermined regions, for cutting said sheet; and a stacking die, positioned between said punches and said predetermined regions, having at least one pin for aligning said sheet, said apparatus further comprising an optical alignment system for positioning said sheet in said blanking apparatus.

11. An apparatus according to claim 7, wherein said web comprises means for preventing said sheet from sagging when said sheet is blanked into said plurality of smaller sheets.

* * * * *